United States Patent [19]

Kemmerer et al.

[11] Patent Number: 4,793,911
[45] Date of Patent: Dec. 27, 1988

[54] APPARATUS FOR THE PRODUCTION OF COATINGS WITH A UNIFORM THICKNESS PROFILE BY CATHODE SPUTTERING

[75] Inventors: Guenther Kemmerer, Alzenau; Hans Wolf, Erlensee, both of Fed. Rep. of Germany

[73] Assignee: Leybold-Heraeus GmbH, Cologne, Fed. Rep. of Germany

[21] Appl. No.: 119,628

[22] Filed: Nov. 12, 1987

[30] Foreign Application Priority Data

Aug. 1, 1987 [DE] Fed. Rep. of Germany ....... 3725571

[51] Int. Cl.$^4$ ............................................. C23C 14/50
[52] U.S. Cl. .................................... 204/298; 118/729; 118/730; 204/192.10; 204/192.12
[58] Field of Search .............. 204/298, 192.10, 192.12; 118/729, 730

[56] References Cited

U.S. PATENT DOCUMENTS 3,785,853  1/1974  Kirkman et al. ................. 427/255.3
4,548,695  10/1985  Sellschopp .......................... 204/298
4,701,251  10/1987  Beardow ............................. 204/298

Primary Examiner—Aaron Weisstuch
Attorney, Agent, or Firm—Felfe & Lynch

[57] ABSTRACT

In an apparatus for the production of coatings with a uniform thickness profile on substrates by cathode sputtering, a substrate carriage held and guided between wheels is provided, which can be moved through the coating chamber, and which has on its side facing the cathode rotatably mounted substrate disks whose axes of rotation are each disposed transversely of the plane of movement of the substrate carriage. On the side of the substrate carriage facing away from the cathode, motor-driven shafts equipped with permanent magnets are journaled in the coating chamber with their longitudinal axes extending in a plane parallel to the plane of movement of the substrate carriage, and they produce a disk current in rotor disks which are affixed co-rotationally to the substrate disks. As a result of the disk current, the rotor disks, and with them the substrate disks, are set in rotation as they pass by the shafts.

5 Claims, 2 Drawing Sheets

APPARATUS FOR THE PRODUCTION OF COATINGS WITH A UNIFORM THICKNESS PROFILE BY CATHODE SPUTTERING

BACKGROUND OF THE INVENTION

The invention relates to an apparatus for the production of coatings with a uniform thickness profile on substrates by cathode sputtering, consisting of a coating chamber, a sputtering cathode held fixedly therein, and a substrate carriage which is held and guided on rails and/or between sliding or rolling bodies and can be moved through the coating chamber transversely of the sputtering cathode.

An apparatus is known (DE-OS 3306 870), which consists of a sputtering cathode and substrate holders on a common chassis which can travel while producing a continuous rotatory movement of the substrate holders with respect to the sputtering cathode. For this purpose a driver wheel is disposed on the chassis, whose axis of rotation is perpendicular to the direction of travel; a drive means is disposed parallel to the direction of travel by which the driver wheel is engaged on a portion of its path, and the driver wheel is coupled with a substrate holder. The drive means is in the form of an endless chain which is guided over two sprockets disposed in tandem in the direction of travel, which can be rotated by a drive motor, and each driver wheel cooperates through a bevel gear transmission with a substrate holder.

This known apparatus has the disadvantage, among others, of being extraordinarily complex and bulky, and at the same time less reliable in operation.

The present invention sets for itself the task of creating an apparatus of the type described above, which will operate without mechanical gearing, make possible an especially low configuration, and run without maintenance, so that in no case will it be necessary to open the coating chamber.

This is accomplished according to the invention by the fact that one or more substrate disks are rotatably mounted on the substrate carriage, on its side facing the cathode. The axes of rotation of these disks are disposed transversely of the plane of movement of the substrate carriage. Motor-driven shafts equipped with magnets are journaled on the side of the substrate carriage facing away from the cathode in the coating chamber, and their longitudinal axes are disposed in plane parallel to the plane of movement of the substrate carriage.

Advantageously also, the substrate carriage is in the form of a substantially rectangular plate on whose upper side a plurality of substrate disks are journaled, while the corresponding axes of rotation are each brought downward through bearing bores in the substrate carriage and joined for co-rotation with rotor disks which cooperate with the shafts provided with magnets.

Preferably, each substrate disk as well as each corresponding rotor disk is provided with a hub, and these hubs are joined together by a shaft; each pair of hubs cooperates with a rolling bearing whose bearing cage is held on the substrate carriage.

In order to produce a disk current that is especially effective in the sense of providing rotation of the substrate disks, the shafts running transversely of the direction of movement of the substrate carriage are of such dimensions that the magnets affixed to the shafts run approximately from the vicinity of the outer edge of a rotor disk approximately to the center of the wheel.

Advantageously, the shaft for mounting a magnet has a shaft-like opening in the area of the rotor disk, into which one or more permanent magnets are inserted, the permanent magnets being of such dimensions that they fill up the shaft-like opening and otherwise are adapted to the rotational contour of the shaft.

BRIEF DESCRIPTION OF THE DRAWING

The invention permits of a great variety of embodiments; one of them is diagrammatically represented in the appended drawings, wherein.

DETAILED DESCRIPTION OF PREFERRED EMBODIMENT

Figure 1:
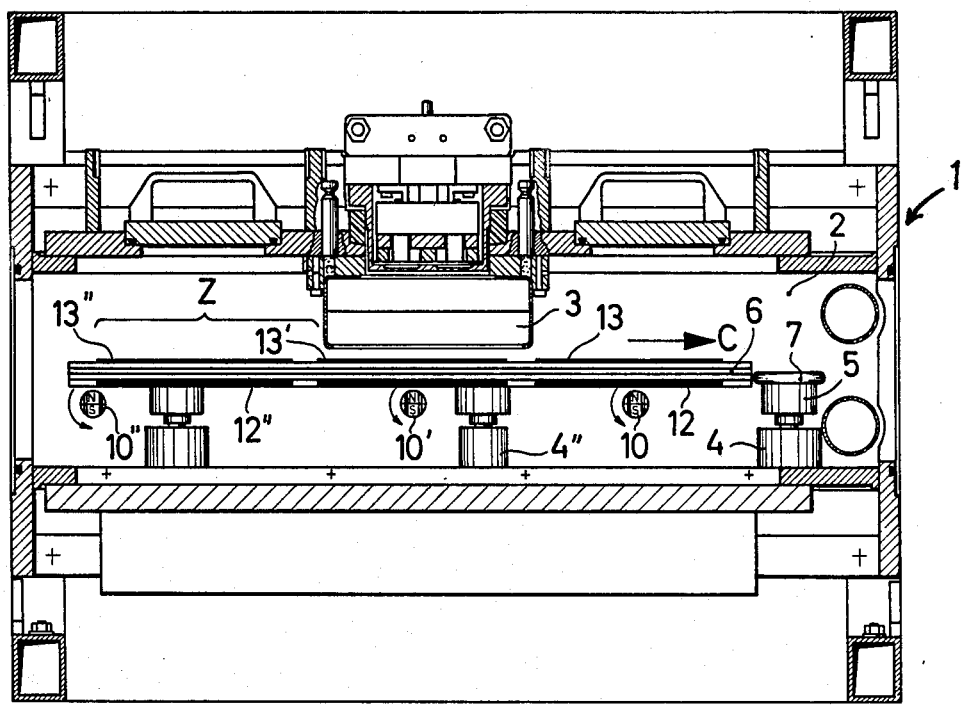
FIG. 1 shows a coating chamber with a sputtering cathode fastened to its roof, and a substrate carriage mounted on wheels underneath the cathode, and a plurality of shafts journaled between the substrate carriage and the bottom of the coating chamber with permanent magnets disposed on them.
Figure 2:
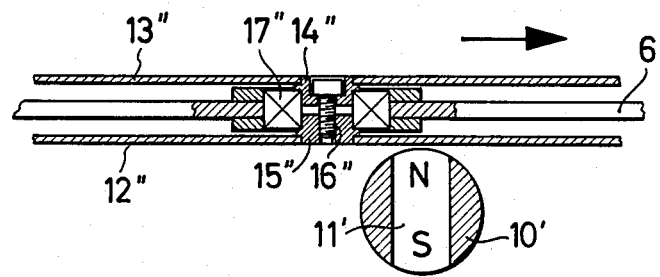
FIG. 2 is an enlarged fragmentary cross section taken at Z on the substrate carriage according to FIG. 1.
Figure 3:
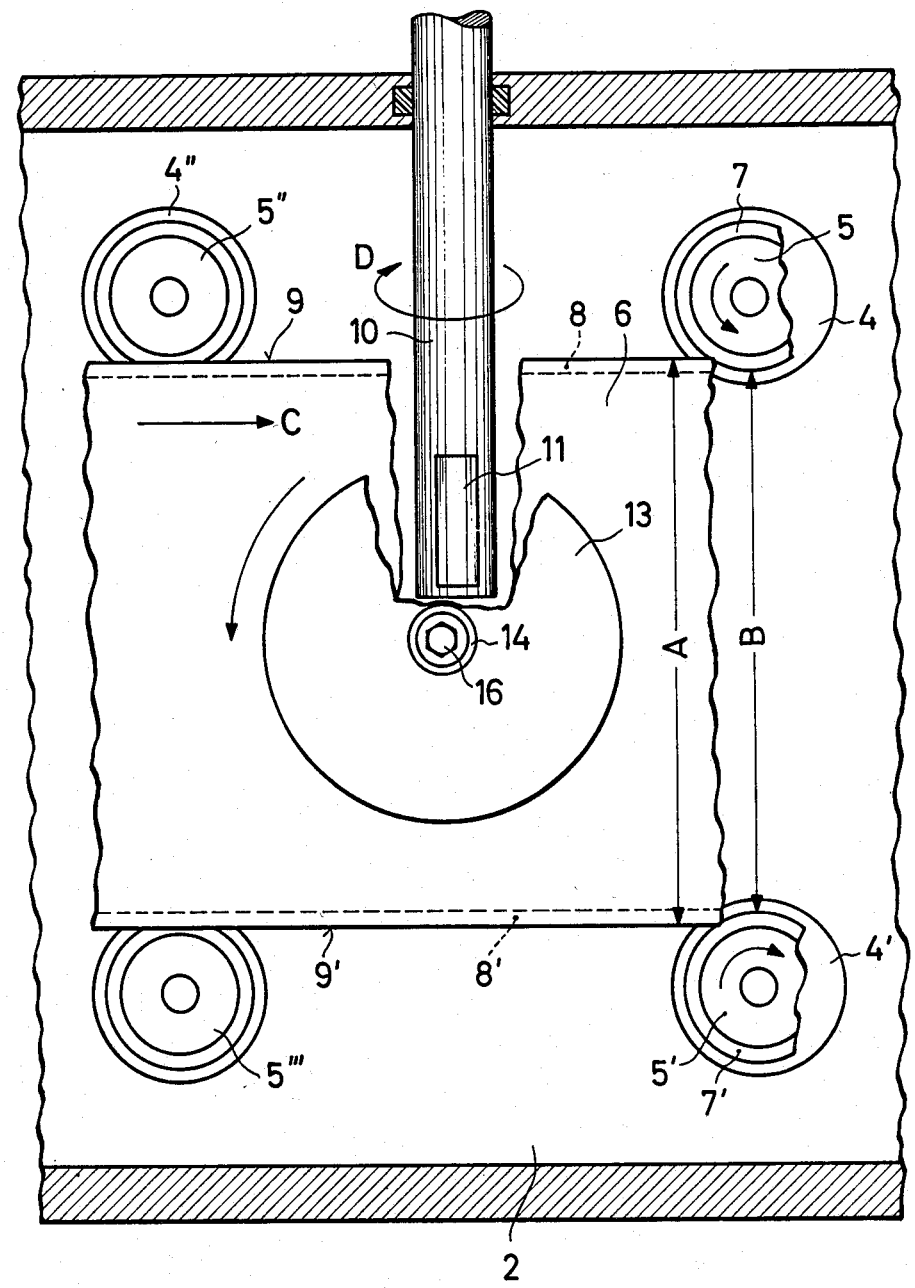
FIG. 3 is an enlarged fragmentary top view of a section of the substrate carriage.

The apparatus for the production of coatings with a uniform thickness profile consists essentially of a machine frame 1 holding a coating chamber 2, the coating chamber 2 having an approximately rectangular cross-sectional profile, and in its interior the sputtering cathode 3 plus two parallel rows of bearing pedestals 4, 4', 4", with guiding wheels 5, 5', 5", rotatably mounted thereon, on which the substrate carriage 6 is guided. The coating chamber 2, open on both sides, corresponds with two locks, which are not represented in the drawing, an which permit the entrance and exit of the substrate carriage 6 (in the direction of the arrow C) into and out of the coating chamber 2, on the one hand, and on the other hand hermetically seal off the interior of the coating chamber 2. The substrate carriage 6 lies with V-shaped longitudinal grooves 8 and 8' made in its two parallel longitudinal edges 9 and 9' against the guiding wheels 5 and 5', whose upper edges 7 and 7' are rounded, the distance A between the two longitudinal edges 9 and 9' of the substrate carriage 2 being made slightly greater than the distance B between the revolving edges 7 and 7' of two guiding wheels 5 and 5'. The movement of the substrate carriage 6 in the direction of the arrow C is produced by the fact that the wheels 5, 5', 5", are driven by electric motors disposed in the bearing pedestals 4, 4', 4", the direction of rotation of the wheels 5, 5', of the one row of rollers being the opposite of the direction of rotation of the wheels 5', 5'" of the other row of wheels.

As FIG. 1 shows, shafts 10, 10', 10" are disposed at certain distances apart underneath the substrate carriage 6, and their axes of rotation are disposed transversely of the direction of movement of the substrate carriage (direction of arrow C). These shafts 10, 10', are electric motor driven and rotate during the coating process in the direction of the arrow D. Since the shafts 10, 10', are provided, at their free ends reaching underneath the substrate carriage 6, with magnets 11, a disk current is produced in the rotor disks 12, which causes the rotor disks 12 and the substrate disks 13 which are joined co-rotationally by the pivot shaft 16 and hubs 14, 15, to rotate about roller bearing 17 whose bearing cage is held by the substrate carriage 6. The shafts in the represented embodiment are brought sealingly through the wall of the coating chamber 2 and are driven by electric motors (not represented) which are fixedly disposed on the outside of the coating chamber. Magnets 11, which are mounted in shaft-like openings in the shafts 10, are adapted to the rotational contour of the shafts and fill up the openings, which extend along the shafts 10 approximately from the vicinity of the outer edge of a rotor disk to approximately the center of the rotor disk.

During the coating process the synchronously rotating wheels 5, 5', transport the substrate carriage 6 slowly in the direction of arrow C, while the rapidly rotating shafts 10, 10', by means of the permanent magnets 11 disposed on the latter, set in rotation the rotor disks 12, 12', and also the substrate disks 13, 13', journaled corotationally with the latter.

The above-described apparatus has the advantage that virtually every part of a workpiece laid or fastened on the substrate disk is moved through the coating chamber in the direction of arrow C at uniform speed and carried past the sputtering cathode 3, but also moves simultaneously across the direction of arrow C, such that an especially uniform and rotationally symmetrical coating thickness can also be produced. The apparatus is extraordinarily reliable in operation and virtually free of wear. Lubrication or special maintenance of any parts of the drive are unnecessary. The apparatus furthermore operates virtually noiselessly, since there are no gear drives or cogbelt drives, for example, to produce noise. Lastly, the coating process can be accurately observed through windows built into the wall of the coating chamber 2, since the shafts 10, 10', are below the substrate carriage, so that a free view of the substrates is possible.

What is claimed is:

1. Apparatus for the production of coatings with a uniform thickness profile on substrates by cathode sputtering, consisting of a coating chamber, a sputtering cathode stationarily held therein, and a substrate carriage guided through the coating chamber transversely of the sputtering cathode, characterized in that the substrate carriage is adapted to have one or more substrate disks rotatably mounted thereon on the side of the substrate carriage facing the cathode, whose axes of rotation are each disposed transversely of the plane of movement of the substrate carriage, while on the side of the substrate carriage facing away from the cathode, motor-driven shafts equipped with magnets are journaled in the coating chamber, and their longitudinal axes are disposed in a plane parallel to a plane of movement of the substrate carriage.

2. Apparatus according to claim 1, characterized in that the substrate carriage is in the form of a substantially rectangular plate having an upper side adapted to have a plurality of substrate disks rotatably mounted thereon, with corresponding axes of rotation being brought downward through bearing bores in the substrate carriage and joined for co-rotation with rotor disks which cooperate with said shafts provided with the magnets.

3. Apparatus according to claim 2, characterized in that each rotor disk has a hub cooperating with a roller bearing whose bearing cage is held by the substrate carriage.

4. Apparatus according to claim 3, characterized in that said shafts extend transversely of the direction of movement of the substrate carriage and are of such dimensions that the magnets on the shafts extend approximately from the vicinity of the outer edge of a rotor disk to approximately the center of the rotor disk.

5. Apparatus according to claim 1, characterized in that each said shaft has for mounting of the magnet a shaft-like opening in range of the rotor disk, into which opening one or more permanent magnets are inserted, the permanent magnets being of such dimensions that they fill up the shaft-like opening and are adapted to the rotational contour of the shaft.

* * * * *